(12) United States Patent
Hu et al.

(10) Patent No.: US 8,968,506 B2
(45) Date of Patent: *Mar. 3, 2015

(54) METHOD FOR MAKING TOUCH PANEL

(75) Inventors: Chun-Yi Hu, New Taipei (TW); Yi-Lin Chang, New Taipei (TW); Chih-Han Chao, New Taipei (TW); Po-Sheng Shih, New Taipei (TW)

(73) Assignee: Shih Hua Technology Ltd., Zhubei, Hsinchu County (TW)

( * ) Notice: Subject to any disclaimer, the term of this patent is extended or adjusted under 35 U.S.C. 154(b) by 241 days.

This patent is subject to a terminal disclaimer.

(21) Appl. No.: 13/339,678

(22) Filed: Dec. 29, 2011

(65) Prior Publication Data

US 2012/0313886 A1  Dec. 13, 2012

(30) Foreign Application Priority Data

Jun. 9, 2011  (TW) .............................. 100120175 A

(51) Int. Cl.
*B29C 65/00* (2006.01)
*B32B 37/00* (2006.01)
*B32B 38/04* (2006.01)
*B82Y 10/00* (2011.01)
*G06F 3/044* (2006.01)
*G06F 3/045* (2006.01)
*H05K 3/38* (2006.01)
*B82Y 30/00* (2011.01)
(Continued)

(52) U.S. Cl.
CPC ................ *B82Y 10/00* (2013.01); *G06F 3/044* (2013.01); *G06F 3/045* (2013.01); *H05K 3/386* (2013.01); *B82Y 30/00* (2013.01); *H05K 3/048* (2013.01); *H05K 3/12* (2013.01); *G06F 2203/04103* (2013.01); *G06F 2203/04113* (2013.01); *H05K 2201/026* (2013.01); *H05K 2201/09972* (2013.01); *Y10S 977/742* (2013.01); *Y10S 977/952* (2013.01)
USPC ..... 156/257; 156/268; 156/272.8; 156/275.5; 345/173; 445/24; 977/742; 977/952

(58) Field of Classification Search
USPC ............. 156/257, 268, 272.8, 275.5, 72, 229, 156/273.3; 345/173; 445/24; 977/742, 952; 216/52, 65, 66; 341/20
See application file for complete search history.

(56) References Cited

U.S. PATENT DOCUMENTS 6,842,171 B2   1/2005  Richter et al.
7,812,083 B2 * 10/2010  Yerushalmi-Rozen ....... 524/495

(Continued)

FOREIGN PATENT DOCUMENTS

CN      1671481      9/2005
CN      1918538      2/2007

(Continued)

*Primary Examiner* — Linda L Gray
(74) *Attorney, Agent, or Firm* — Novak Druce Connolly Bove + Quigg LLP

(57) ABSTRACT

This disclosure is related to a method for making a touch panel. The method includes following steps. A substrate having a surface is provided, wherein the surface defining a touch-view area and a trace area. A first mask layer is supplied to cover the trace area. An adhesive layer is applied on the touch-view area. A carbon nanotube film is placed on the adhesive layer and the first mask layer. The adhesive layer is solidified. The first mask layer and part of the carbon nanotube film on the trace area are removed to expose the trace area. An electrode and a conductive trace are formed on the trace area.

16 Claims, 12 Drawing Sheets

(51) Int. Cl.
*H05K 3/04* (2006.01)
*H05K 3/12* (2006.01)

(56) References Cited

U.S. PATENT DOCUMENTS

| | | | |
|---|---|---|---|
| 8,199,118 B2 | 6/2012 | Pennington et al. | |
| 8,287,678 B2 * | 10/2012 | Feng et al. | 156/166 |
| 2004/0099438 A1 | 5/2004 | Arthur et al. | |
| 2005/0046622 A1 | 3/2005 | Nakanishi et al. | |
| 2005/0090388 A1 * | 4/2005 | Kishi et al. | 502/182 |
| 2005/0126831 A1 | 6/2005 | Richter et al. | |
| 2005/0275415 A1 | 12/2005 | Sato et al. | |
| 2008/0129317 A1 | 6/2008 | Oba | |
| 2009/0159188 A1 | 6/2009 | Jiang et al. | |
| 2010/0271330 A1 | 10/2010 | Philipp | |
| 2011/0018424 A1 | 1/2011 | Takada | |
| 2011/0050636 A1 | 3/2011 | Nagata et al. | |
| 2011/0095770 A1 | 4/2011 | Kurashima | |
| 2011/0115740 A1 * | 5/2011 | Qian et al. | 345/174 |
| 2011/0157038 A1 * | 6/2011 | Feng | 345/173 |

FOREIGN PATENT DOCUMENTS

| | | | | |
|---|---|---|---|---|
| CN | 101464763 | 6/2009 | | |
| CN | 101593066 | 12/2009 | | |
| CN | 101625617 | 1/2010 | | |
| JP | 2004027134 | * 1/2004 | | C09J 9/02 |
| JP | 2011-95806 | 5/2011 | | |
| TW | 200912721 | 3/2009 | | |
| TW | 201103042 | 1/2011 | | |
| TW | 201115442 | 5/2011 | | |

* cited by examiner

METHOD FOR MAKING TOUCH PANEL

CROSS-REFERENCE TO RELATED APPLICATIONS

This application claims all benefits accruing under 35 U.S.C. §119 from Taiwan Patent Application No. 100120175, filed on Jun. 9, 2011, in the Taiwan Intellectual Property Office, the contents of which are hereby incorporated by reference. This application is related to applications entitled, "TOUCH PANEL", filed 2011 Dec. 29, with application Ser. No. 13/339,643; and "METHOD FOR MAKING TOUCH PANEL", filed on 2011 Dec. 29, with application Ser. No. 13/339,658; and "METHOD FOR MAKING TOUCH PANEL", filed on 2011 Dec. 29, with application Ser. No. 13/339,664; and "PATTERNED CONDUCTIVE ELEMENT", filed on 2011 Dec. 29, with application Ser. No. 13/339,671; and "METHOD FOR MAKING TOUCH PANEL", filed on 2011 Dec. 29, with application Ser. No. 13/339,681; and "METHOD FOR MAKING TOUCH PANEL", filed on 2011 Dec. 29, with application Ser. No. 13/339,688; and "TOUCH PANEL", filed on 2011 Dec. 29, with application Ser. No. 13/339,696; and "METHOD FOR MAKING PATTERNED CONDUCTIVE ELEMENT", filed on 2011 Dec. 29, with application Ser. No. 13/339,700; and "METHOD FOR MAKING PATTERNED CONDUCTIVE ELEMENT", filed on 2011 Dec. 29, with application Ser. No. 13/339,703; and "TOUCH PANEL", filed on 2011 Dec. 29, with application Ser. No. 13/339,709; and "TOUCH PANEL", filed on 2011 Dec. 29, with application Ser. No. 13/339,718.

BACKGROUND

1. Technical Field

The present disclosure relates to touch panels and method for making the same, particularly, to a carbon nanotube based touch panel and a method for making the same.

2. Description of Related Art

In recent years, various electronic apparatuses such as mobile phones, car navigation systems have advanced toward high performance and diversification. There is continuous growth in the number of electronic apparatuses equipped with optically transparent touch panels in front of their display devices such as liquid crystal panels. A user of such electronic apparatus operates it by pressing a touch panel with a finger or a stylus while visually observing the display device through the touch panel. Thus a demand exists for such touch panels which superior in visibility and reliable in operation. Due to a higher accuracy and a low-cost of the production, the resistance-type touch panels have been widely used.

A conventional resistance-type or capacitance-type touch panel includes a conductive indium tin oxide (ITO) layer as an optically transparent conductive layer. However, the ITO layer is generally formed by means of ion-beam sputtering and etched by laser beam, and the method is relatively complicated. Furthermore, the ITO layer has poor wearability, low chemical endurance and uneven resistance in an entire area of the panel. Additionally, the ITO layer has a relatively low transparency. All the above-mentioned problems of the ITO layer produce a touch panel with low sensitivity, accuracy, and brightness.

What is needed, therefore, is to provide a touch panel and a method for making the same which can overcome the short come described above.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

References will now be made to the drawings to describe, in detail, various embodiments of the present touch panels and method for making the same.

Figure 1:
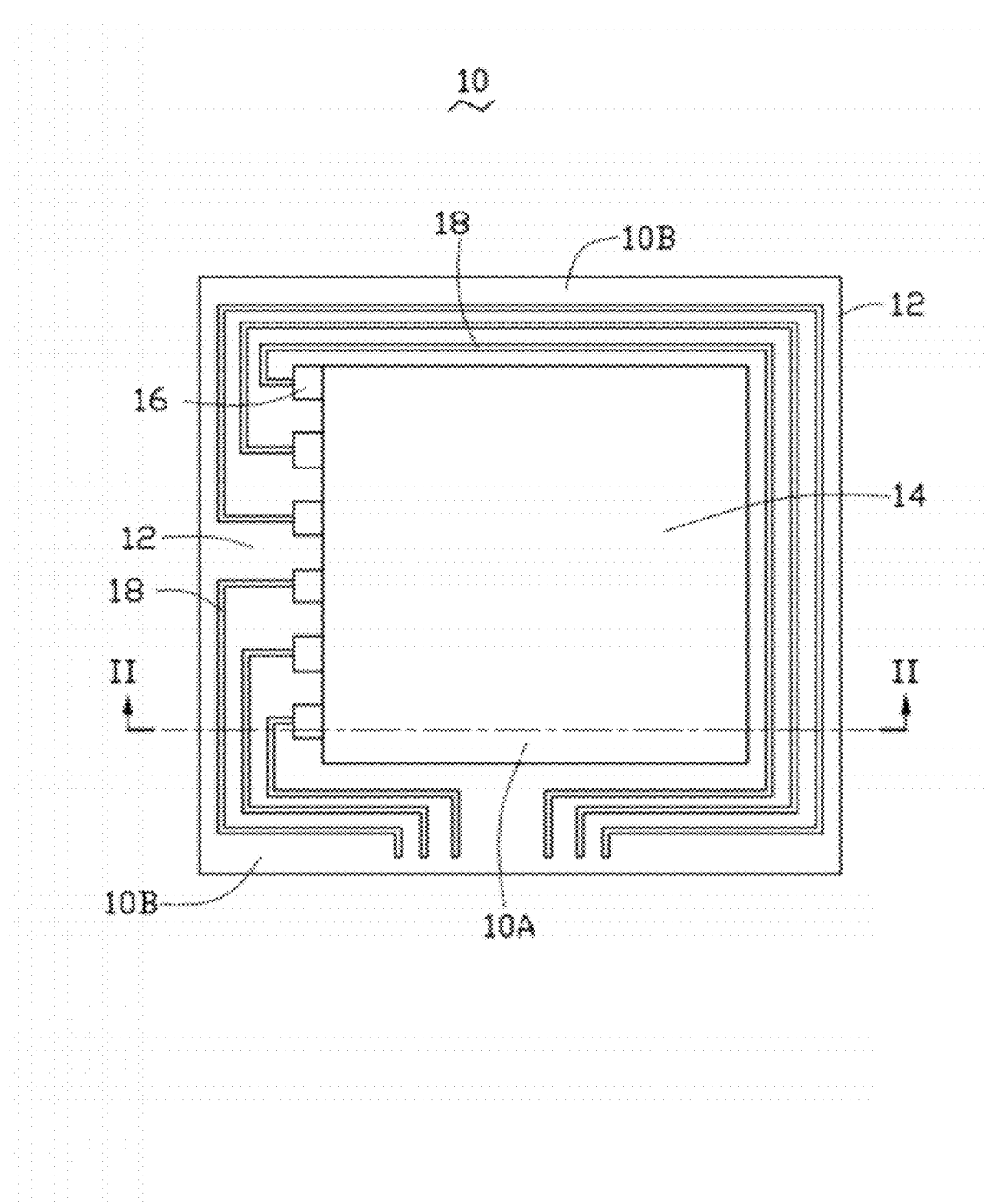
FIG. 1 is a schematic, top view of one embodiment of a touch panel.
Figure 2:
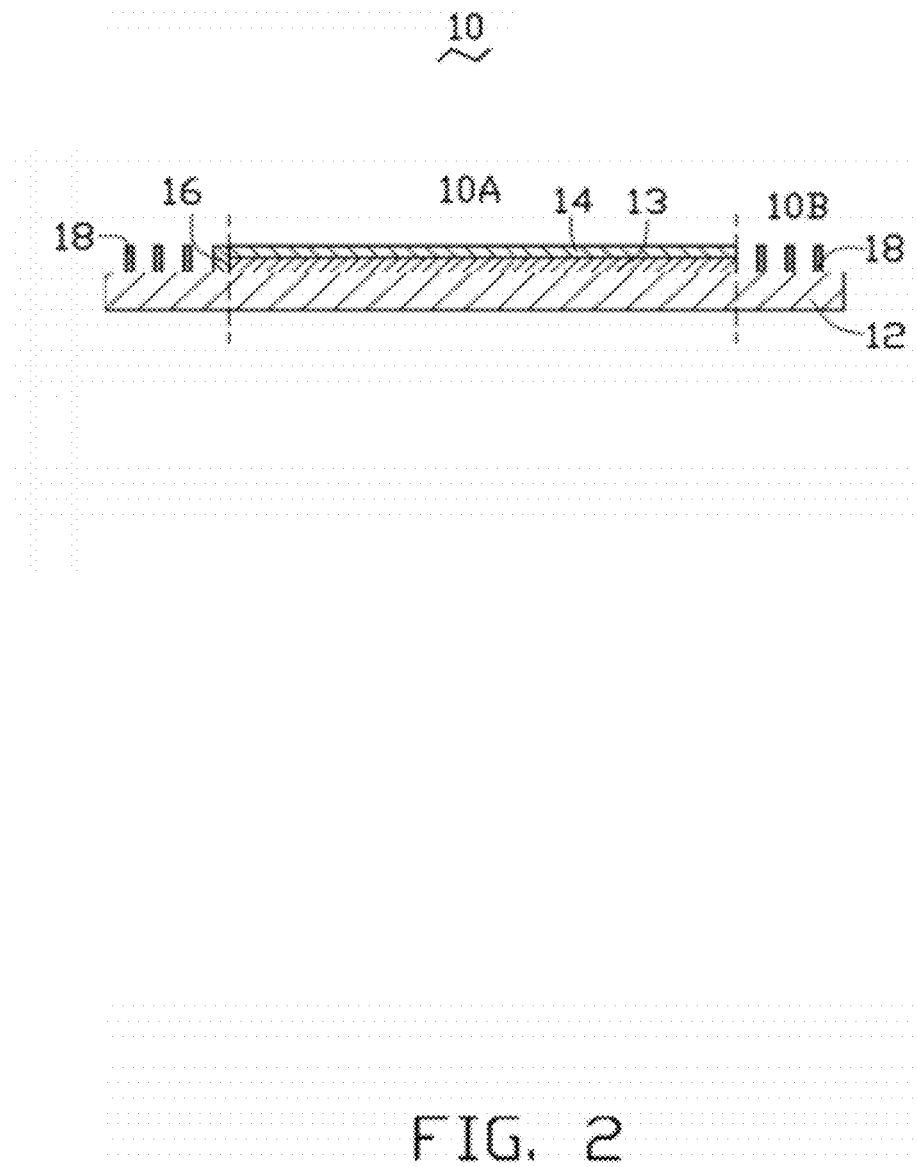
FIG. 2 is a schematic, cross-sectional view, along a line II-II of FIG. 1.

Referring to FIGS. 1 and 2, a touch panel 10 of one embodiment includes a substrate 12, an adhesive layer 13, a transparent conductive layer 14, at least one electrode 16, and a conductive trace 18.

The touch panel 10 defines two areas: a touch-view area 10A and a trace area 10B. The touch-view area 10A is typically a center area of the touch panel 10 which can be touched and viewed to realize the control function. The trace area 10B is usually a periphery area of the touch panel 10 which can be used to support the conductive trace 18. The touch-view area 10A has a relatively large area. The trace area 10B is located on at least one side of the touch-view area 10A. The positional relationship of the touch-view area 10A and the trace area 10B can be selected according to need. In one embodiment, the shape of the touch panel 10 is a rectangle, and the positional relationship of the touch-view area 10A and the trace area 10B is given as below.

For example, the trace area 10B can be an annular region on the periphery, and the touch-view area 10A is a square region on the center and surrounded by the trace area 10B. For example, the trace area 10B can be a strip-shaped region on one side of the touch panel 10, and the touch-view area 10A is rest of the touch panel 10 except the trace area 10B. For example, the trace areas 10B can be two strip-shaped regions on opposite sides of the touch panel 10, and the touch-view area 10A is the region between the trace areas 10B. For example, the trace area 10B can be an L-shaped region on adjacent two sides of the touch panel 10, and the touch-view area 10A is the rest of the touch panel 10 except the trace area 10B. For example, the trace area 10B can be a U-shaped region on three adjacent sides of the touch panel 10, and the touch-view area 10A is the rest of the touch panel 10 except the trace area 10B. In one embodiment, the touch-view area 10A is the center region having a shape the same as that is the shape of touch panel 10 and surrounded by the trace area 10B.

The adhesive layer 13 is located on a surface of the substrate 12. The transparent conductive layer 14 is located on a surface of the adhesive layer 13. Both the adhesive layer 13 and the transparent conductive layer 14 are located only on the touch-view area 10A. The electrode 16 and the conductive trace 18 are located on a surface of the substrate 12 and only on the trace area 10B. Because the adhesive layer 13 is located only on the touch-view area 10A and the electrode 16 and the conductive trace 18 are located only on the trace area 10B, the electrode 16 and the conductive trace 18 can have a relative large thickness substantially same as the thickness of the adhesive layer 13. The thickness of transparent conductive layer 14 is very small and can be omitted.

If the electrode 16 and the conductive trace 18 are located on the adhesive layer 13, following problems will be caused. When the thickness of the electrode 16 and the conductive trace 18 is too small, the conductivity and durability of the electrode 16 and the conductive trace 18 will be low and short. When the thickness of the electrode 16 and the conductive trace 18 is too great, the surface of the touch panel 10 will be too rough. The electrode 16 and the conductive trace 18 can have the same thickness which is equal to the total thickness of the adhesive layer 13 and the transparent conductive layer 14. The thickness of the electrode 16 and the conductive trace 18 can be in a range from about 1 micrometer to about 500 micrometers. In one embodiment, the thickness of the electrode 16 and the conductive trace 18 can be in a range from about 100 micrometers to about 200 micrometers. In one embodiment, the thickness of the electrode 16 and the conductive trace 18 can be in a range from about 1 micrometer to about 2 micrometers. In one embodiment, the thickness of the electrode 16 and the conductive trace 18 is about 1.5 micrometers.

Furthermore, because the transparent conductive layer 14 is located only on the touch-view area 10A and the conductive trace 18 is located only on the trace area 10B, the conductive trace 18 and the transparent conductive layer 14 do not overlap. Because the conductive trace 18 and the transparent conductive layer 14 have no overlapping part, no capacitance signal interference will be produced between the transparent conductive layer 14 and the conductive trace 18 when the touch-view area 10A is touched by a finger or a stylus. Thus, the accuracy of the touch panel 10 is improved.

The electrode 16 is located on at least one side of the transparent conductive layer 14 and electrically connected with the transparent conductive layer 14 and the conductive trace 18. The position of the electrode 16 depends on the work principle of the touch panel 10 and the detection methods of the touch-point. The number of the electrode 16 depends on the area and resolution of the touch panel 10. In one embodiment, the touch panel 10 includes six electrodes 16 spaced from each other, arranged on one side of the transparent conductive layer 14. The electrodes 16 can be made of material such as metal, carbon nanotube, conductive silver paste, or ITO. The electrodes 16 can be made by etching a metal film, etching an ITO film, or printing a conductive silver paste. The conductive trace 18 is electrically connected with an external circuit (not shown). The conductive trace 18 includes a plurality of conductive wires. The conductive trace 18 can be made of material such as metal, conductive silver paste, or ITO. The conductive trace 18 can be made by etching a metal film, etching an ITO film, or printing a conductive silver paste. In one embodiment, both the conductive trace 18 and the electrodes 16 are made of conductive silver paste and made by printing conductive silver paste concurrently. The conductive silver paste can include about 50% to about 90% (by weight) of the metal powder, about 2% to about 10% (by weight) of the glass powder, and about 8% to about 40% (by weight) of the binder.

The substrate 12 can be flat or curved and configured to support other elements. The substrate 12 is insulative and transparent. The substrate 12 can be made of rigid materials such as glass, quartz, diamond, plastic or any other suitable material. The substrate 12 can also be made of flexible materials such as polycarbonate (PC), polymethyl methacrylate acrylic (PMMA), polyimide (PI), polyethylene terephthalate (PET), polyethylene (PE), polyether polysulfones (PES), polyvinyl polychloride (PVC), benzocyclobutenes (BCB), polyesters, or acrylic resin. In one embodiment, the substrate 12 is a flat and flexible PET plate.

The transparent conductive layer 14 includes a carbon nanotube film. The carbon nanotube film includes a plurality of carbon nanotubes. The carbon nanotube film can be a substantially pure structure of the carbon nanotubes, with few impurities and chemical functional groups. A majority of the carbon nanotubes are arranged to extend along the direction substantially parallel to the surface of the carbon nanotube film. The carbon nanotubes in the carbon nanotube film can be single-walled, double-walled, or multi-walled carbon nanotubes. The length and diameter of the carbon nanotubes can be selected according to need, for example the diameter can be in a range from about 0.5 nanometers to about 50 nanometers and the length can be in a range from about 200 nanometers to about 900 nanometers. The thickness of the carbon nanotube film can be in a range from about 0.5 nanometers to about 100 micrometers, for example in a range from about 100 nanometers to about 200 nanometers. The carbon nanotube film has a good flexibility because of the good flexibility of the carbon nanotubes therein.

The carbon nanotubes of the carbon nanotube film can be arranged orderly to form an ordered carbon nanotube structure or disorderly to form a disordered carbon nanotube structure. The term 'disordered carbon nanotube structure' includes, but is not limited to, to a structure where the carbon nanotubes are arranged along many different directions, and the aligning directions of the carbon nanotubes are random. The number of the carbon nanotubes arranged along each different direction can be almost the same (e.g. uniformly disordered). The carbon nanotubes in the disordered carbon nanotube structure can be entangled with each other. The term 'ordered carbon nanotube structure' includes, but is not limited to, to a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

In one embodiment, the carbon nanotube film is a free-standing structure. The term "free-standing structure" means that the carbon nanotube film can sustain the weight of itself when it is hoisted by a portion thereof without any significant damage to its structural integrity. Thus, the carbon nanotube film can be suspended by two spaced supports. The free-standing carbon nanotube film can be laid on the epitaxial growth surface 101 directly and easily.

Figure 3:
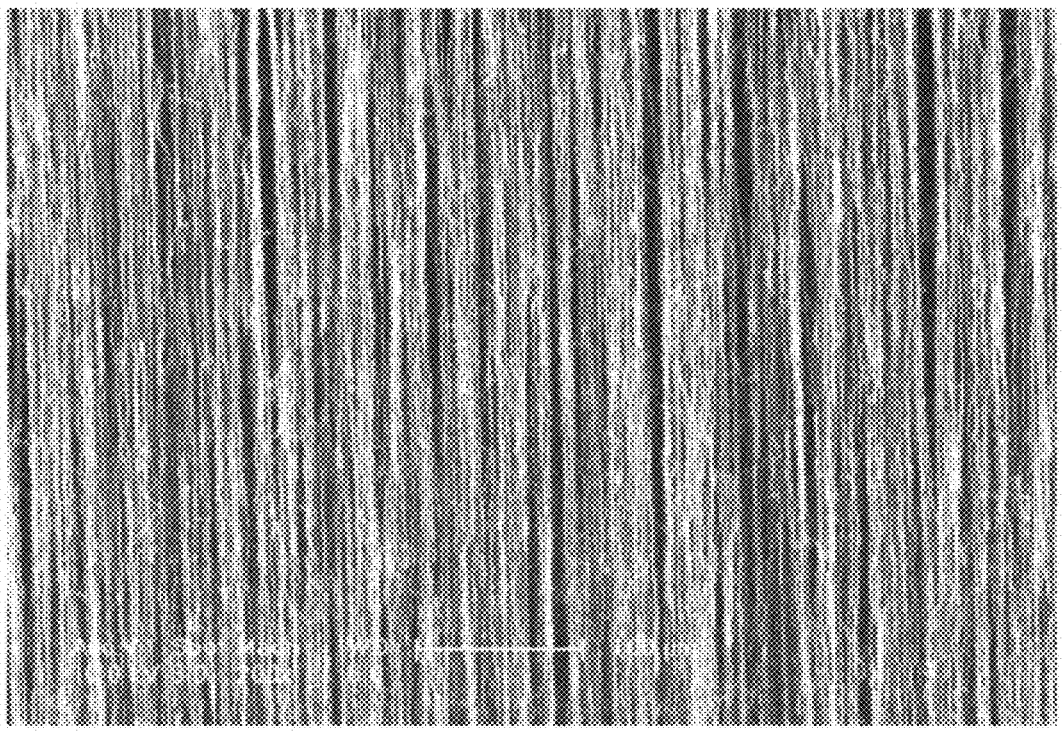
FIG. 3 is a Scanning Electron Microscope (SEM) image of a carbon nanotube film.

In one embodiment, the transparent conductive layer 14 is a single carbon nanotube film. The carbon nanotube film includes a plurality of successive and oriented carbon nanotubes joined end-to-end by van der Waals attractive force therebetween. The carbon nanotube film is a free-standing film. Referring to FIG. 3, each carbon nanotube film includes a plurality of successively oriented carbon nanotube segments joined end-to-end by van der Waals attractive force therebetween. Each carbon nanotube segment includes a plurality of carbon nanotubes parallel to each other, and combined by van der Waals attractive force therebetween. Some variations can occur in the carbon nanotube film. The carbon nanotubes in the carbon nanotube film are oriented along a preferred orientation. The carbon nanotube film can be treated with an organic solvent to increase the mechanical strength and toughness and reduce the coefficient of friction of the carbon nanotube film. A thickness of the carbon nanotube film can range from about 0.5 nanometers to about 100 micrometers.

The transparent conductive layer 14 can include at least two stacked carbon nanotube films. In other embodiments, the transparent conductive layer 14 can include two or more coplanar carbon nanotube films. Additionally, when the carbon nanotubes in the carbon nanotube film are aligned along one preferred orientation, an angle can exist between the orientations of carbon nanotubes in adjacent films, whether stacked or adjacent. Adjacent carbon nanotube films can be combined by only the van der Waals attractive force therebetween. An angle between the aligned directions of the carbon nanotubes in two adjacent carbon nanotube films can range from about 0 degrees to about 90 degrees. When the angle between the aligned directions of the carbon nanotubes in adjacent stacked carbon nanotube films is larger than 0 degrees, a plurality of micropores is defined by the carbon nanotube film. Stacking the carbon nanotube films will also add to the structural integrity of the carbon nanotube film.

The carbon nanotube film can be made by the steps of: growing a carbon nanotube array on a wafer by chemical vapor deposition method; and drawing the carbon nanotubes of the carbon nanotube array to from the carbon nanotube film. During the drawing step, the carbon nanotubes are joined end-to-end by van der Waals attractive force therebetween along the drawing direction. The carbon nanotube film has the smallest resistance along the drawing direction and the greatest resistance along a direction perpendicular to the drawing direction. Thus, the carbon nanotube film is resistance anisotropy. Furthermore, the carbon nanotube film can be etched or irradiated by laser. After being irradiated by laser, a plurality of parallel carbon nanotube conductive strings will be formed and the resistance anisotropy of the carbon nanotube film will not be damaged because the carbon nanotube substantially extending not along the drawing direction are removed by burning. Each carbon nanotube conductive string comprises a plurality of carbon nanotubes joined end-to-end by van der Waals attractive force.

The adhesive layer 13 is configured to fix the carbon nanotube film on the substrate 12. Part of the carbon nanotubes of the carbon nanotube film are embedded in the adhesive layer 13 and part of the carbon nanotubes are exposed from the adhesive layer 13. In one embodiment, most of the carbon nanotubes are embedded in the adhesive layer 13. The adhesive layer 13 is transparent and can be made of materials such as hot plastic or UV (Ultraviolet Rays) glue, for example PVC or PMMA. The thickness of the adhesive layer 13 can be in a range from about 1 nanometer to about 500 micrometers, for example, the thickness is in a range from about 1 micrometer to about 2 micrometers. In one embodiment, the adhesive layer 13 is a UV glue layer with a thickness of 1.5 micrometers.

Figure 4:
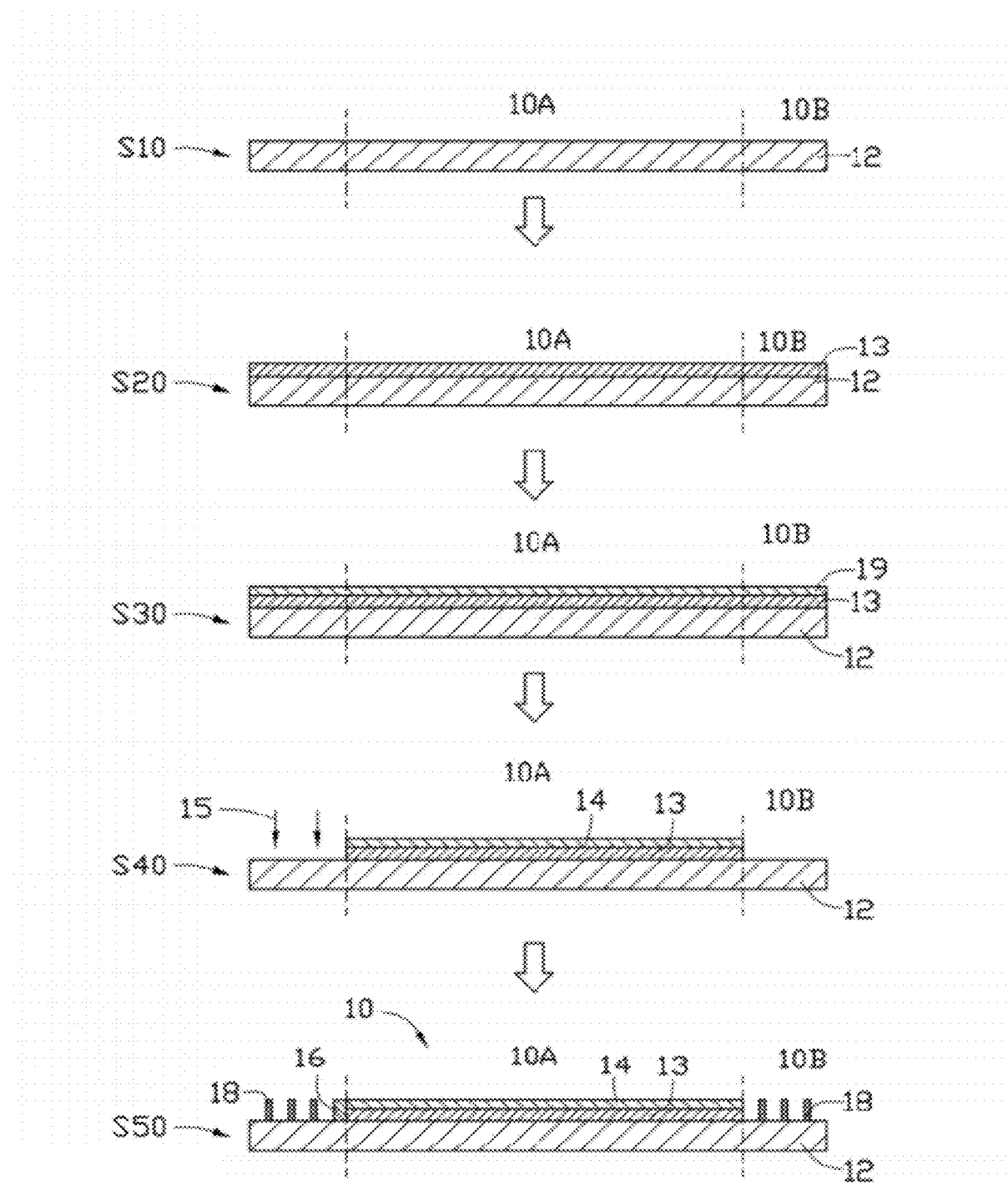
FIG. 4 is a flowchart of one embodiment of a method for making a single touch panel.

Referring to FIG. 4, a method for making the touch panel 10 of one embodiment includes the steps of:

step (S10), providing a substrate 12, wherein the substrate 12 defines two areas: a touch-view area 10A and a trace area 10B;

step (S20), applying an adhesive layer 13 on a surface of the substrate 12;

step (S30), placing a carbon nanotube film 19 on a surface of the adhesive layer 13, and solidifying the adhesive layer 13 to fix the carbon nanotube film 19;

step (S40), removing part of the carbon nanotube film 19 and the part of the adhesive layer 13 that are on the trace area 10B to obtain a transparent conductive layer 14 and expose part of the substrate 12 that is on the trace area 10B; and step (S50), forming an electrode 16 and a conductive trace 18 on the exposed part of the substrate 12 that is on the trace area 10B.

In step (S10), the substrate 12 is a flat glass plate.

In step (S20), the adhesive layer 13 can be any adhesive which can be solidified on a certain condition. The adhesive layer 13 is transparent and can be made of materials such as hot plastic or UV glue, for example PVC or PMMA. The adhesive layer 13 can be formed by spin-coating, spraying, or brushing. In one embodiment, a UV glue layer with a thickness of 1.5 micrometers is formed on the substrate 12 by spin-coating.

In step (S30), the carbon nanotube film 19 can be formed by transfer printing a preformed carbon nanotube film, filtering and depositing a carbon nanotube suspension, or laying a free-standing carbon nanotube film. In one embodiment, the carbon nanotube film 19 is drawn from a carbon nanotube array and then placed on the adhesive layer 13 directly. The carbon nanotube film 19 can be infiltrated into the adhesive layer 13 after being placed on the adhesive layer 13. In one embodiment, part of the carbon nanotube film 19 is infiltrated into the adhesive layer 13, and part of the carbon nanotube film 19 is exposed through of the adhesive layer 13. Furthermore, a step of pressing the carbon nanotube film 19 can be performed after step (S30) to allow more carbon nanotubes of the carbon nanotube film 19 to infiltrate into the adhesive layer 13.

The method for solidifying the adhesive layer 13 depends on the material of the adhesive layer 13. The thermoplastic adhesive layer 13 can be solidified by cooling, the thermosetting adhesive layer 13 can be solidified by heating, and the UV glue adhesive layer 13 can be solidified by irradiating with ultraviolet light. In one embodiment, because part of the carbon nanotube film 19 is infiltrated into the adhesive layer 13, the carbon nanotube film 19 is fixed by the adhesive layer 13 during solidifying the adhesive layer 13. In one embodiment, the adhesive layer 13 is UV glue layer and solidified by ultraviolet light irradiating for about 2 seconds to about 30 seconds, for example, irradiating for about 4 seconds.

In step (S40), part of the carbon nanotube film 19 that is on the trace area 10B and part of the adhesive layer 13 that is on the trace area 10B are removed. The removing step can be performed by a method such as laser-beam etching, ion-beam etching, or electron-beam etching. In one embodiment, a laser beam 15 is controlled by a computer (not shown) to etch the part of the carbon nanotube film 19 and the part of the adhesive layer 13 that are on the trace area 10B. The part of the carbon nanotube film 19 on the trace area 10B is removed, and the part of the carbon nanotube film 19 on the touch-view area 10A is maintained to form the transparent conductive layer 14.

In step (S50), the electrode 16 and the conductive trace 18 can be made by a method such as screen printing, chemical vapor deposition, or magnetron sputtering. In one embodiment, the electrode 16 and the conductive trace 18 are formed only on the trace area 10B and have the same thickness which is equal to total thickness of the adhesive layer 13 and the transparent conductive layer 14. The electrode 16 and the conductive trace 18 are formed concurrently by printing conductive silver paste. The conductive silver paste can include about 50% to about 90% (by weight) of the metal powder, about 2% to about 10% (by weight) of the glass powder, and about 8% to about 40% (by weight) of the binder.

Furthermore, a step of planarizing the exposed part of the substrate 12 on the trace area 10B can be performed before step (S50), because the exposed part of the substrate 12 on the trace area 10B will has a rough surface caused by etching. The step of planarizing can be performed by mechanical polishing or coating an insulating layer. The step of planarizing allows the exposed part of the substrate 12 on the trace area 10B fit for printing conductive silver paste.

Furthermore, an optically clear adhesive (OCA) layer and a cover lens can be applied on the touch panel 10 to cover the transparent conductive layer 14, the electrode 16, and the conductive trace 18. Thus, a touch screen is obtained.

Figure 5:
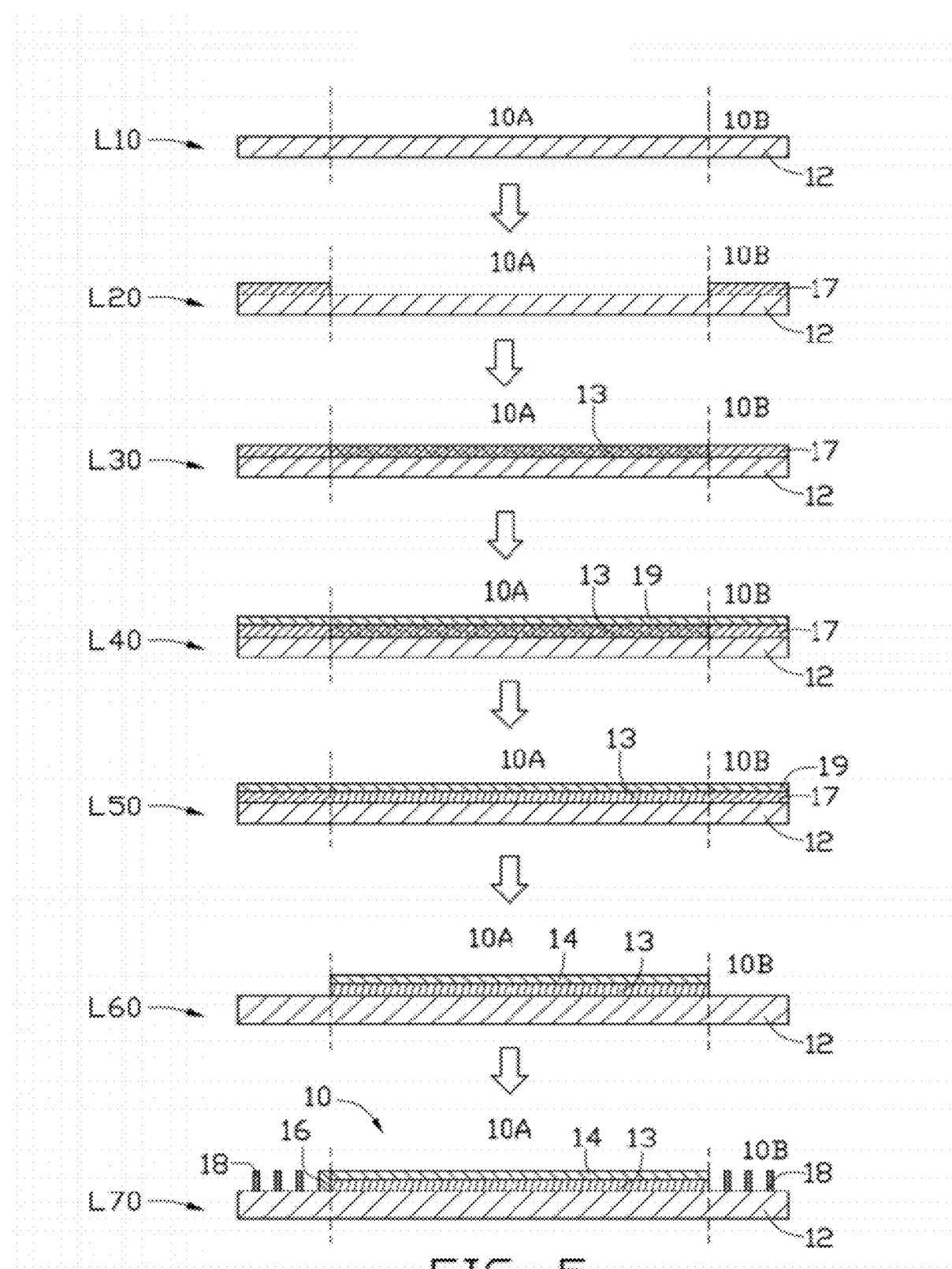
FIG. 5 is a flowchart of one embodiment of a method for making a single touch panel.

Referring to FIG. 5, a method for making the touch panel 10 of another embodiment includes the steps of:

step (L10), providing a substrate 12, wherein the substrate 12 defines two areas: a touch-view area 10A and a trace area 10B;

step (L20), forming a first mask layer 17 to cover the trace area 10B;

step (L30), applying an adhesive layer 13 on a surface of the substrate 12 and only on the touch-view area 10A;

step (L40), placing a carbon nanotube film 19 on the adhesive layer 13 and the first mask layer 17;

step (L50), solidifying the adhesive layer 13 to fix the carbon nanotube film 19;

step (L60), removing the first mask layer 17 and part of the carbon nanotube film 19 that on the trace area 10B to obtain a transparent conductive layer 14 and expose part of the substrate 12 that on the trace area 10B; and step (L70), forming an electrode 16 and a conductive trace 18 on the exposed part of the substrate 12 that is on the trace area 10B.

In step (L10), the substrate 12 is a flat and flexible PET plate.

In step (L20), the first mask layer 17 is a free-standing structure that can be easily peeled off as a whole from the substrate 12. The first mask layer 17 can be made of polymer such as PC, PMMA, PI, PET, PE, PES, PVC, BCB, polyesters, or acrylic resin. In one embodiment, the first mask layer 17 is a PET film frame with a thickness of about 1.5 micrometers.

In step (L30), the adhesive layer 13 can be formed by spin-coating, spraying, or brushing. In one embodiment, a UV glue layer with a thickness of 1.5 micrometers is formed on the substrate 12 by spraying. Furthermore, a second mask layer (not shown) can be applied to cover the first mask layer 17 before applying the adhesive layer 13 and removed after applying the adhesive layer 13. Thus, the adhesive layer 13 will not remain on the first mask layer 17. In one embodiment, the shape and area of the second mask layer are same as that of the first mask layer 17. The thickness of the second mask layer is less than that of the first mask layer 17.

In step (L40), the carbon nanotube film 19 can be formed by transfer printing a preformed carbon nanotube film, filtering and depositing a carbon nanotube suspension, or laying a free-standing carbon nanotube film. In one embodiment, the carbon nanotube film 19 is drawn from a carbon nanotube array and then placed on the adhesive layer 13 and the first mask layer 17 directly. The carbon nanotube film 19 on the touch-view area 10A can be infiltrated into the adhesive layer 13. In one embodiment, part of the carbon nanotube film 19 is infiltrated into the adhesive layer 13, and part of the carbon nanotube film 19 is exposed through of the adhesive layer 13. The carbon nanotube film 19 on the trace area 10B is only located on and connected with the first mask layer 17 by van der Waals attractive force.

In step (L50), the method for solidifying the adhesive layer 13 depends on the material of the adhesive layer 13. Because part of the carbon nanotube film 19 is infiltrated into the adhesive layer 13, the carbon nanotube film 19 is fixed by the adhesive layer 13 during solidifying the adhesive layer 13. In one embodiment, the adhesive layer 13 is UV glue layer and solidified by ultraviolet light irradiating for about 2 seconds to about 30 seconds, for example, irradiating for about 4 seconds.

In step (L60), the entire first mask layer 17 is peeled off as a whole from the substrate 12. The part of the carbon nanotube film 19 on the trace area 10B is removed together with the first mask layer 17. The part of carbon nanotube film 19 that is on the touch-view area 10A is fixed on the substrate 12 by the adhesive layer 13 to form the transparent conductive layer 14. Because the transparent conductive layer 14 is fabricated easily by removing the first mask layer 17, the efficiency of making touch panel 10 is improved. The first mask layer 17 can be recycled and the cost of the touch panel 10 is decreased.

In step (L70), the electrode 16 and the conductive trace 18 can be made by a method such as screen printing, chemical vapor deposition, or magnetron sputtering. In one embodiment, the electrode 16 and the conductive trace 18 are formed concurrently by printing conductive silver paste.

Figure 6:
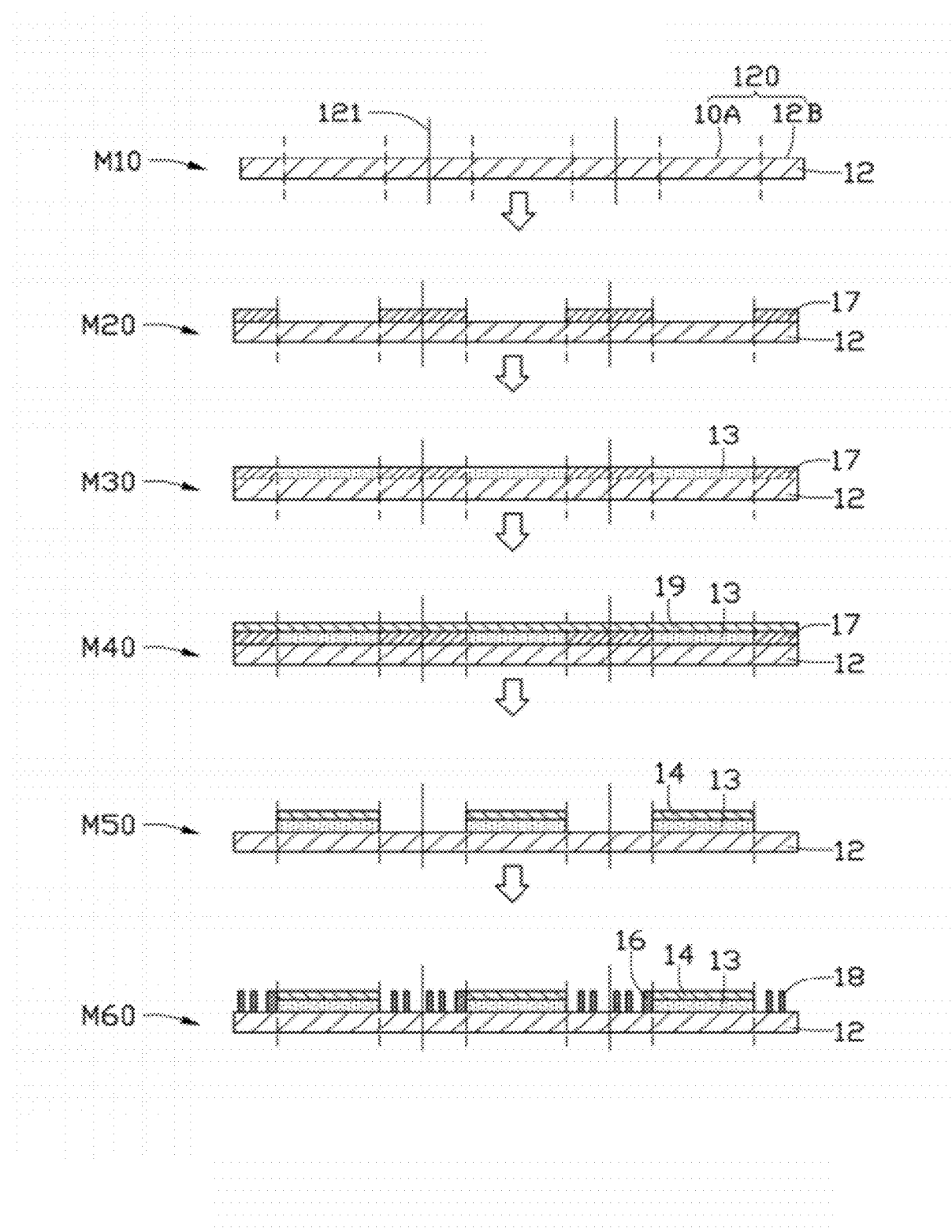
FIG. 6 is a flowchart of one embodiment of a method for making a plurality of touch panels.

Referring to FIG. 6, a method for making a plurality of touch panels 10 of one embodiment includes the steps of:

step (M10), providing a substrate 12 having a surface defining a plurality of target areas 120, each target area 120 including two areas: a touch-view area 10A and a trace area 10B;

step (M20), forming a first mask layer 17 to cover the trace area 10B of each target area 120;

step (M30), forming an adhesive layer 13 on the touch-view area 10A of each target area 120;

step (M40), forming a carbon nanotube film 19 on all the adhesive layers 13 and all the first mask layers 17, and solidifying the adhesive layers 13 to fix the carbon nanotube film 19;

step (M50), removing the first mask layer 17 and part of the carbon nanotube film 19 on the trace areas 10B to obtain a plurality of transparent conductive layers 14 spaced from each other and expose parts of the substrate 12 that are on the trace areas 10B;

step (M60), forming an electrode 16 and a conductive trace 18 on the exposed part of the substrate 12 that on the trace area 10B of each target area 120; and step (M70), cutting and obtaining a plurality of touch panels 10.

Figure 7:
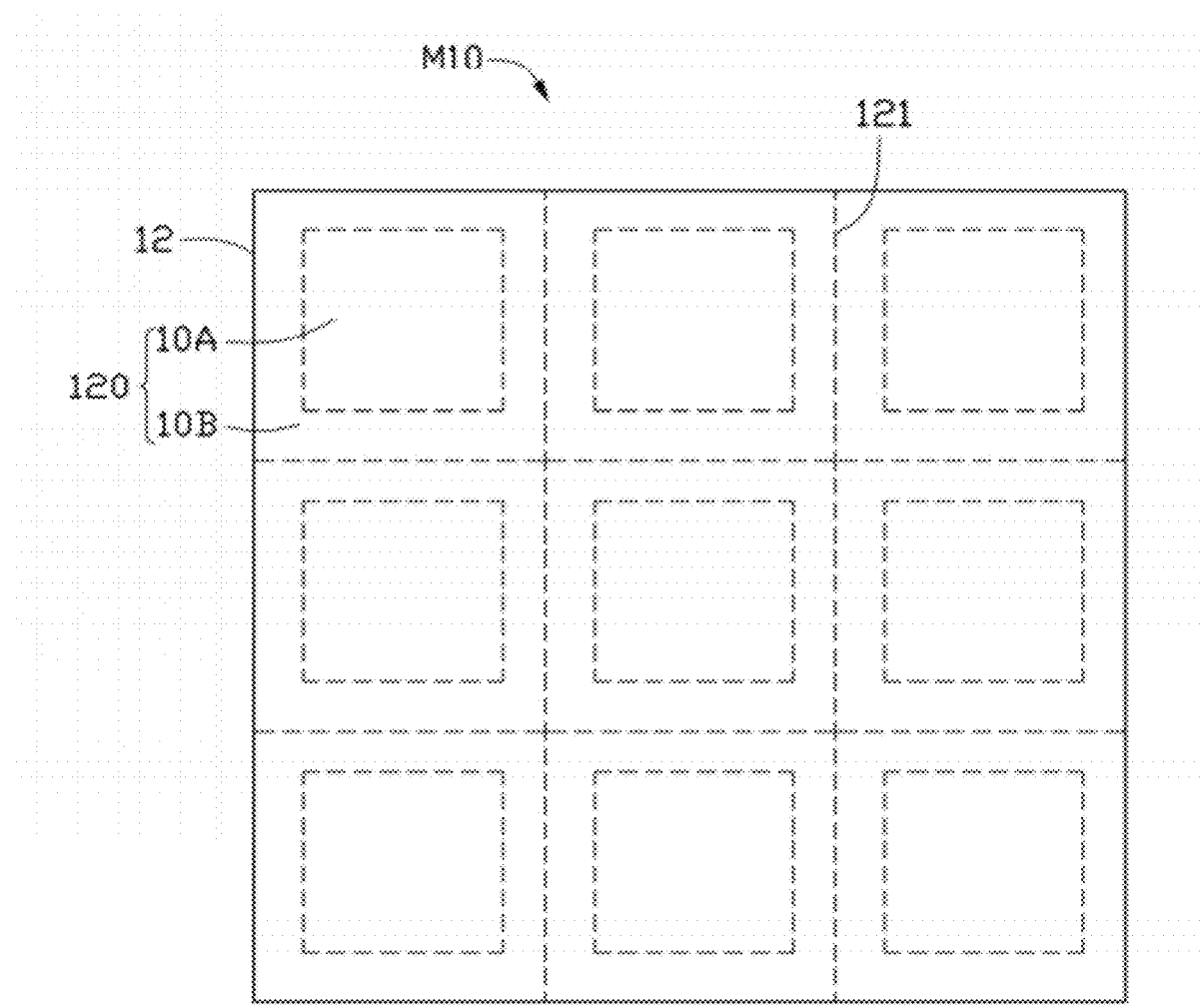
FIG. 7 is a schematic, top view of one embodiment of step (M10) of FIG. 6.

In step (M10), the shape and size of the target areas 120 can be selected according to need. Referring to FIG. 7, in one embodiment, the surface of the substrate 12 is divided into nine target areas 120 arranged in an array of three rows and three columns by four cutting lines 121. The target areas 120 have the same shape and size. The touch-view area 10A is typically a center area of the touch panel 10 which can be touched and viewed to realize the control function. The trace area 10B is usually a periphery area of the touch panel 10 which can be used to support the conductive trace 18. The touch-view area 10A has a relatively large area. The trace area 10B is located on at least one side of the touch-view area 10A. The positional relationship of the touch-view area 10A and the trace area 10B can be selected according to need. In one embodiment, the shape of the touch panel 10 is a rectangle, the touch-view area 10A is the center region having a shape the same as that is the shape of touch panel 10 and surrounded by the trace area 10B.

Figure 8:
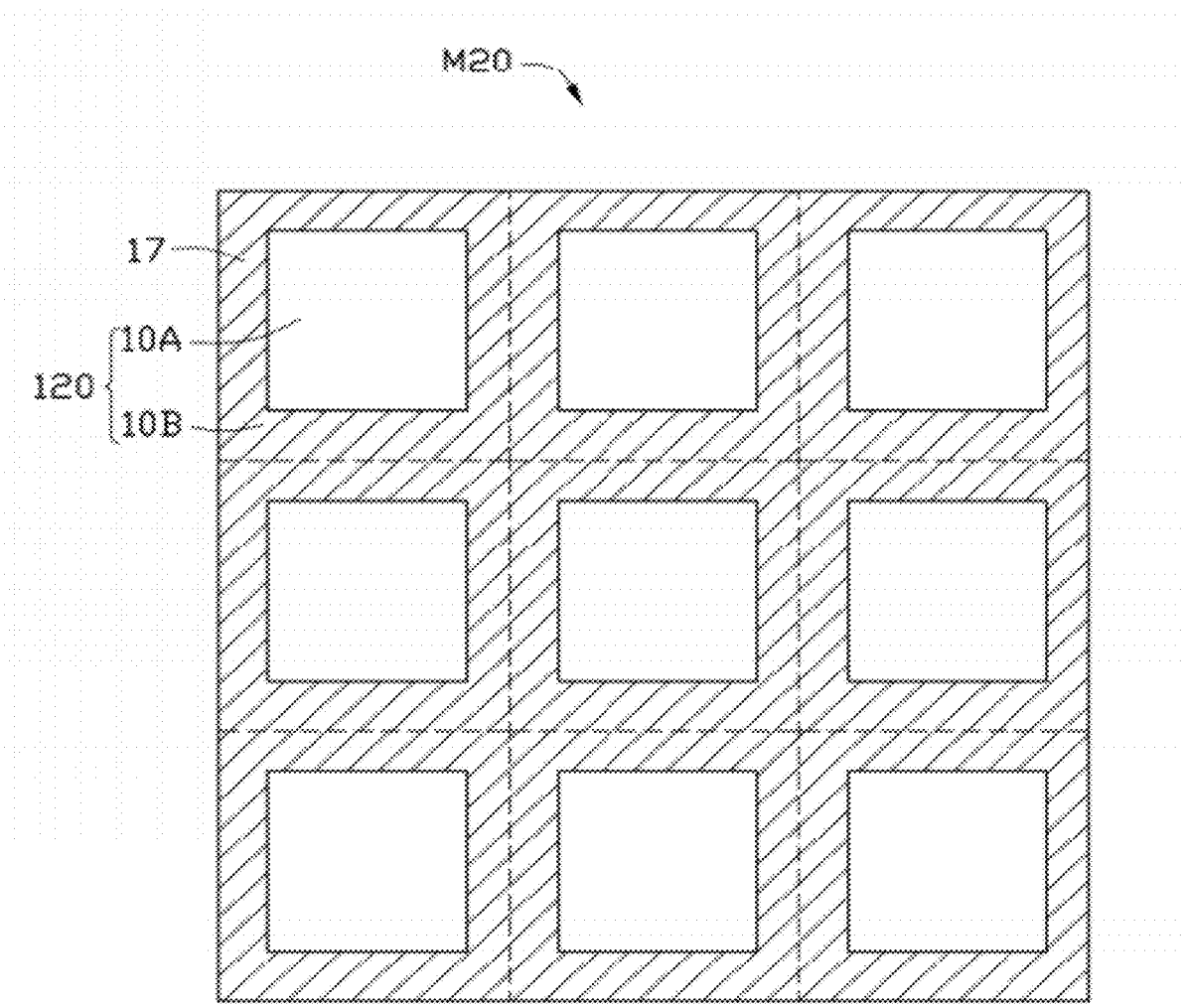
FIG. 8 is a schematic, top view of one embodiment of step (M20) of FIG. 6.

In step (M20), the first mask layer 17 covers all the trace areas 10B of the substrate 12 as shown in FIG. 8. In one embodiment, the first mask layer 17 is a single PET film with a thickness of about 1.5 micrometers and defining a plurality of square openings.

Figure 9:
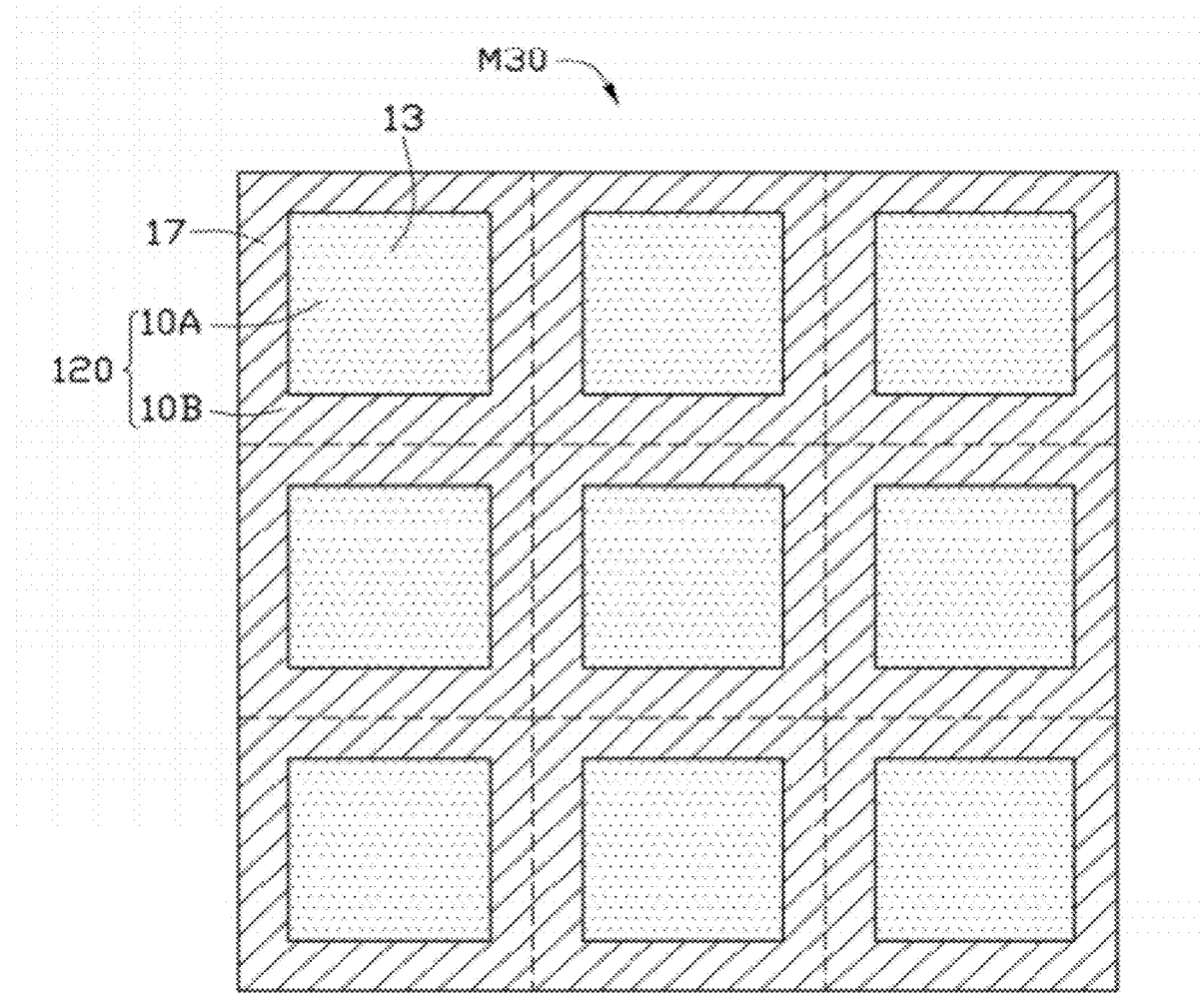
FIG. 9 is a schematic, top view of one embodiment of step (M30) of FIG. 6.

In step (M30), the adhesive layer 13 can be formed by spin-coating, spraying, or brushing. In one embodiment, the substrate 12 is a PET film. The adhesive layer 13 is an UV glue layer with a thickness of 1.5 micrometers and formed on the substrate 12 by spraying. Furthermore, a second mask layer (not shown) can be applied to cover the first mask layer 17 before applying the adhesive layer 13 and removed after applying the adhesive layer 13. Thus, the adhesive layer 13 will not remain on the first mask layer 17 as shown in FIG. 9.

Figure 10:
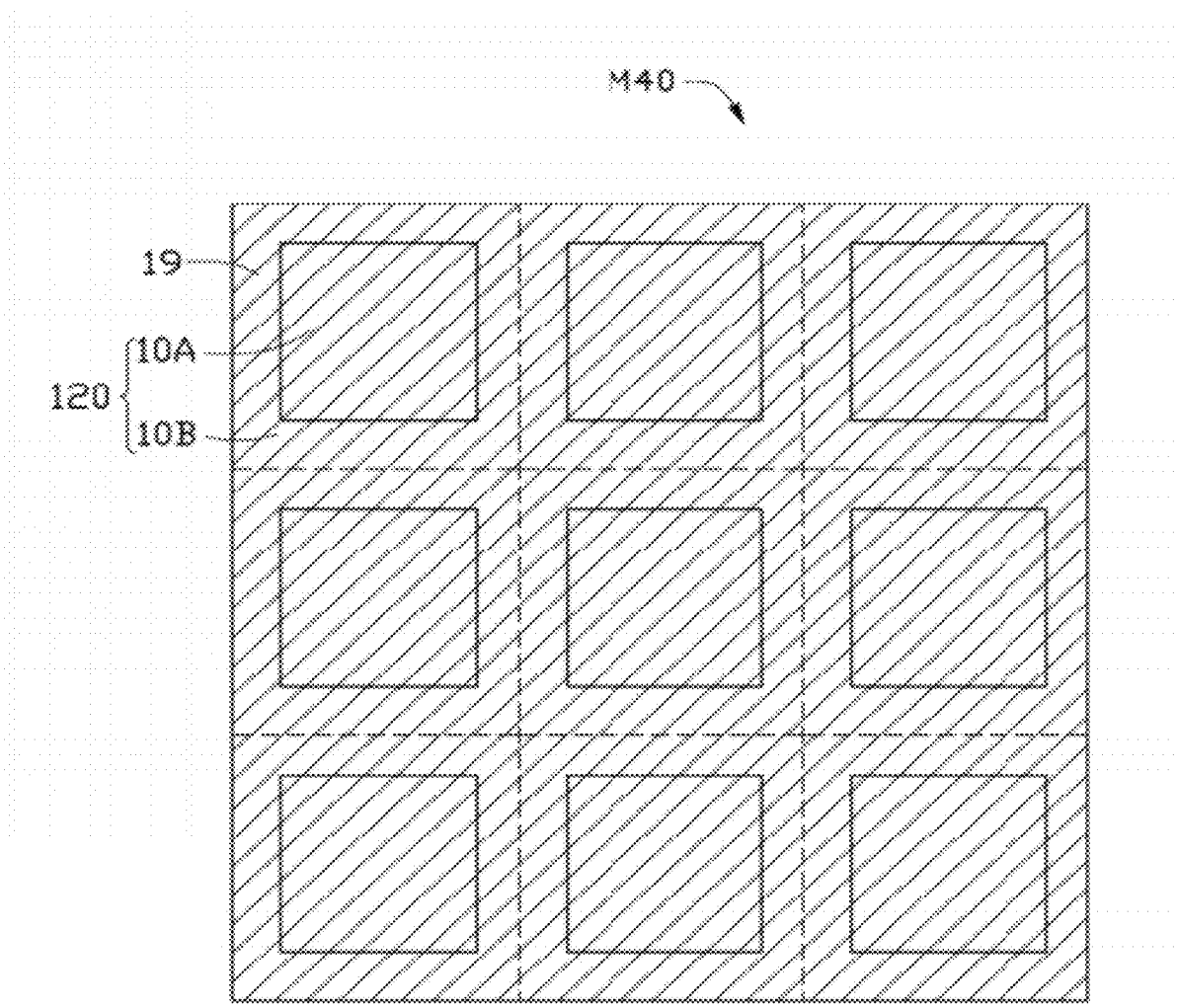
FIG. 10 is a schematic, top view of one embodiment of step (M40) of FIG. 6.

In step (M40), the carbon nanotube film 19 can be formed by transfer printing a preformed carbon nanotube film, filtering and depositing a carbon nanotube suspension, or laying a free-standing carbon nanotube film. The carbon nanotube film 19 can cover the entire substrate 12 as shown in FIG. 10. When the width of the free-standing carbon nanotube film is less than the width of the substrate 12, a plurality of free-standing carbon nanotube films can be coplanarly placed on the adhesive layer 13 and the first mask layer 17 side by side. Each two contacting sides of each two adjacent free-standing carbon nanotube films can be overlapped with the cutting lines 121 between two adjacent target areas 120.

The method for solidifying the adhesive layer 13 depends on the material of the adhesive layer 13. In one embodiment, the adhesive layer 13 is UV glue layer and solidified by ultraviolet light irradiating for about 4 seconds.

Figure 11:
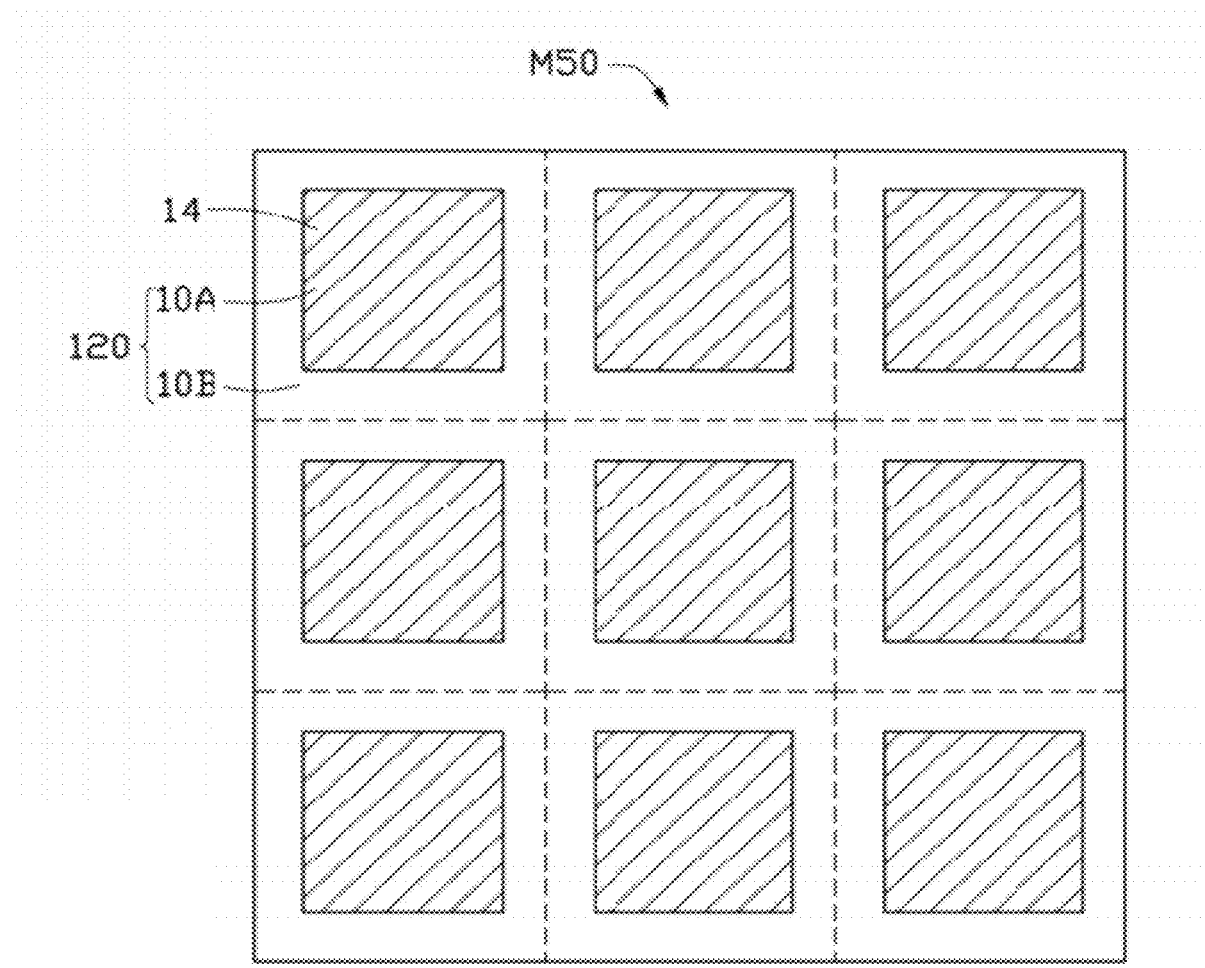
FIG. 11 is a schematic, top view of one embodiment of step (M50) of FIG. 6.

In step (M50), the entire first mask layer 17 is peeled off from the substrate 12 as a whole. The parts of the carbon nanotube film 19 on the trace areas 10B are removed together with the first mask layer 17. The parts of the carbon nanotube film 19 on the touch-view areas 10A are fixed on the substrate 12 to form the plurality of transparent conductive layers 14 spaced from each other as shown in FIG. 11.

Figure 12:
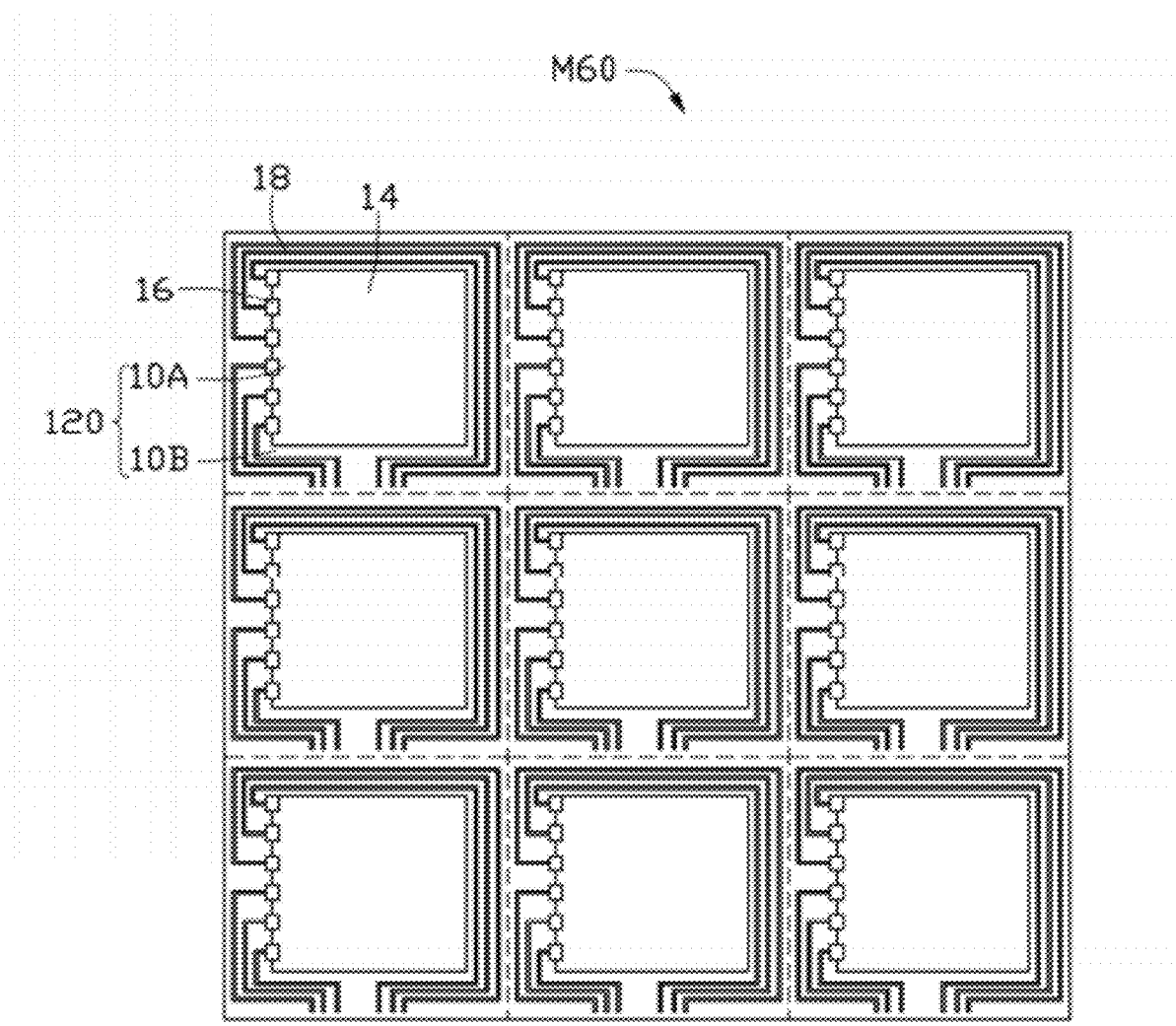
FIG. 12 is a schematic, top view of one embodiment of step (M60) of FIG. 6.

In step (M60), the electrode 16 and the conductive trace 18 can be made of material such as metal, carbon nanotube, conductive silver paste, or ITO and made by etching a metal film, etching an ITO film, or printing a conductive silver paste. Referring to FIG. 12, in one embodiment, all the electrodes 16 and the conductive traces 18 are formed concurrently by printing conductive silver paste.

In step (M70), the step of cutting can be performed by a laser beam or a mechanical device such as a blade. In one embodiment, the target areas 120 of the substrate 12 are cut and separated from each other by blade from the cutting lines 121. The blade can move along the row direction firstly and then along the column direction. Thus, the plurality of touch panels 10 is obtained.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method for making a touch panel, the method comprising:
   providing a substrate having a surface, wherein the surface comprising a touch-view area and a trace area;
   supplying a first mask layer to cover the trace area;
   applying an adhesive layer on the touch-view area;
   placing a carbon nanotube film on the adhesive layer and the first mask layer;
   solidifying the adhesive layer;
   removing the first mask layer and part of the carbon nanotube film on the trace area to expose the trace area; and
   forming an electrode and a conductive trace on the trace area.

2. The method of claim 1, wherein the first mask layer is a free-standing structure and comprises a polymer.

3. The method of claim 1, further comprising placing a second mask layer to cover the first mask layer before applying the adhesive layer and removing the second mask layer after applying the adhesive layer.

4. The method of claim 1, wherein the carbon nanotube film is formed by filtering and depositing a carbon nanotube suspension.

5. The method of claim 1, wherein the carbon nanotube film is a free-standing structure that is drawn from a carbon nanotube array; and the carbon nanotube film is laid on the adhesive layer directly.

6. The method of claim 1, wherein after applying the carbon nanotube film on the adhesive layer, the carbon nanotube film has a first portion infiltrated into the adhesive layer and a second portion exposed out of the adhesive layer.

7. The method of claim 1, further comprising pressing the carbon nanotube film after applying the carbon nanotube film on the adhesive layer.

8. The method of claim 1, wherein the adhesive layer comprises UV glue and is solidified by ultraviolet light irradiating.

9. The method of claim 1, wherein the first mask layer is peeled off as a whole.

10. The method of claim 9, wherein the part of the carbon nanotube film on the trace area is removed together with the first mask layer.

11. The method of claim 1, wherein the electrode and the conductive trace are formed only on the trace area and have the same thickness which is equal to total thickness of the adhesive layer and the carbon nanotube film.

12. The method of claim 1, wherein the electrode and the conductive trace are formed concurrently by printing conductive silver paste.

13. A method for making a plurality of touch panels, the method comprising:

providing a substrate having a surface, the surface defining a plurality of target areas, each target area comprising a touch-view area and a trace area;

supplying a first mask layer to cover the trace area of each target area;

applying an adhesive layer on the touch-view area of each target area;

placing a carbon nanotube film on the adhesive layer and the first mask layer;

solidifying the adhesive layer;

removing the first mask layer and part of the carbon nanotube film on the trace area of each target area to expose the trace area of each target area; and forming an electrode and a conductive trace on the trace area of each target area.

14. The method of claim 13, wherein the first mask layer is peeled off as a whole and the part of the carbon nanotube film on the trace area of each target area is removed together with the first mask layer.

15. The method of claim 14, wherein a plurality of carbon nanotube films are coplanarly laid on the adhesive layer and the first mask layer side by side, and each two contacting sides of each two adjacent carbon nanotube films are overlapped with a cutting line between two adjacent target areas.

16. The method of claim 14, further comprising a step of cutting the substrate after forming the electrode and the conductive trace on each trace area.

* * * * *